United States Patent
Fifield et al.

(10) Patent No.: US 10,026,494 B2
(45) Date of Patent: Jul. 17, 2018

(54) WORD LINE VOLTAGE GENERATOR FOR CALCULATING OPTIMUM WORD LINE VOLTAGE LEVEL FOR PROGRAMMABLE MEMORY ARRAY

(71) Applicant: GLOBALFOUNDRIES INC., Grand Cayman (KY)

(72) Inventors: John A. Fifield, Burlington, VT (US); Eric D. Hunt-Schroeder, Essex Junction, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/790,543

(22) Filed: Oct. 23, 2017

(65) Prior Publication Data

US 2018/0075921 A1 Mar. 15, 2018

Related U.S. Application Data

(62) Division of application No. 15/266,201, filed on Sep. 15, 2016, now Pat. No. 9,837,168.

(51) Int. Cl.
| | | |
|---|---|---|
| G11C 17/00 | (2006.01) | |
| G11C 17/18 | (2006.01) | |
| G11C 5/14 | (2006.01) | |
| G11C 8/08 | (2006.01) | |

(52) U.S. Cl.
CPC .............. G11C 17/18 (2013.01); G11C 5/147 (2013.01); G11C 8/08 (2013.01)

(58) Field of Classification Search
CPC ........... G11C 17/18; G11C 17/16; G11C 5/14; G11C 5/147; G11C 2216/26

USPC .......................................................... 365/96
See application file for complete search history.

(56) References Cited

U.S. PATENT DOCUMENTS

| | | | |
|---|---|---|---|
| 6,473,344 B2 | 10/2002 | Kim et al. | |
| 7,173,875 B2 | 2/2007 | Chan et al. | |
| 8,630,132 B2 | 1/2014 | Cheng et al. | |
| 9,311,980 B1 | 4/2016 | Gogl et al. | |
| 2010/0198896 A1 | 8/2010 | Hoefler | |
| 2014/0001568 A1 | 1/2014 | Wang et al. | |
| 2015/0138868 A1* | 5/2015 | Castalino | G11C 17/18 365/104 |
| 2016/0099073 A1 | 4/2016 | Cernea | |
| 2016/0112042 A1 | 4/2016 | Hanson et al. | |
| 2016/0217832 A1* | 7/2016 | Jayaraman | G11C 7/065 |
| 2016/0372164 A1* | 12/2016 | Anand | G11C 7/065 |

OTHER PUBLICATIONS

Specification "Latching Current Sensing Amplifier for Memory Array" and Drawings for related U.S. Appl. No. 14/744,800, filed Jun. 19, 2016, 21 pages.

* cited by examiner

Primary Examiner — Tha-O H Bui
(74) Attorney, Agent, or Firm — Anthony Canale; Andrew M. Calderon; Roberts Mlotkowski Safran Cole & Calderon, P.C.

(57) ABSTRACT

A method of generating a high differential read current through a non-volatile memory, includes receiving a voltage read input from a word line voltage generator, outputting a first current to a bit line true (BLT), outputting a second current to a bit line complement (BLC), and generating the high differential read current through a difference between the first current and the second current.

14 Claims, 4 Drawing Sheets

WORD LINE VOLTAGE GENERATOR FOR CALCULATING OPTIMUM WORD LINE VOLTAGE LEVEL FOR PROGRAMMABLE MEMORY ARRAY

FIELD OF THE INVENTION

The present disclosure relates to a word line voltage generator, and more particularly, to a word line voltage generator for calculating an optimum word line voltage level over process, voltage, and temperature conditions and outputting a buffered voltage supply for a programmable memory array.

BACKGROUND

Various types of non-volatile memory (NVM) technologies exist. Most non-volatile memory devices, such as programmable read-only memory (PROM), electrically programmable read-only-memory (EPROM), electrically erasable programmable ROM (EEPROM), flash EEPROM's, or other electric memory devices require additional processing operations which increase costs, increases the likelihood of misprocessing, and requires a longer manufacturing time. Additionally, there are various types of one-time programmable memory arrays (OTPM) that represent embedded non-volatile memory (NVM) technologies.

In techniques of sensing in OTPM, a voltage-sensing method occurs where the word line level is ramped slowly so as to allow conduction from the un-programmed field effect transistor (FET) to a respective bit line before conduction occurs in the other bit line from the programmed FET (i.e., slew sense method). Therefore, the polarity of a voltage signal is set, and is detected by a half-latch. The half-latch is set automatically without a timing pulse as a result of the detected voltage signal.

SUMMARY

In an aspect of the disclosure, a method of generating a high differential read current through a non-volatile memory includes receiving a voltage read input from a word line voltage generator, outputting a first current to a bit line true (BLT), outputting a second current to a bit line complement (BLC), and generating the high differential read current through a difference between the first current and the second current.

In another aspect of the disclosure, a method of biasing a word line gate voltage of a differential storage cell to generate a high differential read current includes injecting a predetermined current into an array of FET devices to generate a voltage monitor signal, inputting the voltage monitor signal to a summing circuit in which discrete voltage levels are added or subtracted to the voltage monitor signal to generate a target voltage, driving the target voltage to a plurality of differential storage cells for biasing the word line gate voltage near a threshold voltage of a field effect transistor (FET), reading the high differential read current from the differential storage cell, and sensing the high differential read current as a digital logic level in response to a positive polarity or negative polarity of the high differential read current.

In another aspect of the disclosure, a word line control circuit for a differential memory array includes a voltage monitor circuit which receives a current into an array of field effect transistor (FET) devices to generate a voltage monitor, a digital to analog converter which adds or subtracts an overdrive voltage to the voltage monitor to generate an optimum read word line voltage, and a plurality of field effect transistor (FET) memory cells which are arranged in differential transistor pairs and which share a word line corresponding to the optimum read word line voltage.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a word line voltage generator, and more particularly, to a word line voltage generator for calculating an optimum word line voltage level over process, voltage, and temperature conditions and outputting a buffered voltage supply for a programmable memory array. In embodiments, the present disclosure relates to a one time programmable memory array which uses a twin-cell and a pair of field effect transistors (FETs) programmed with different voltage thresholds (Vts).

In embodiments, differential sensing is performed to translate the difference in Vts to a "1" or a "0" data type. Further, in embodiments, sense-signal is maximized at a word line voltage level at a mid-point between Vss and Vdd power supply voltage levels. Advantageously, an optimum word line voltage level can be calculated over process, voltage, and temperature conditions and a buffered voltage supply can be output for the word line drivers and the one-time programmable memory arrays (OTPM). Thus, in the embodiments, a word line voltage generator outputs a precise voltage level for voltage sensing or current sensing in an OTPM cell.

In embodiments of the present disclosure, a non-volatile storage cell includes a pair of FET devices arranged to output a positive or a negative differential current in response to a stored data type. Further, in an example of the present disclosure, a cell storing a "1" data type may be configured to have a higher voltage threshold (i.e., Vt) on a first FET and a lower voltage threshold (i.e., Vt) on a second FET. A "0" data type may be defined with the lower voltage threshold (i.e., Vt) on the first FET and a higher voltage threshold (i.e., Vt) on the second FET.

In embodiments of the present disclosure, a differential pair of FETs with dissimilar voltage thresholds will produce a maximum differential read current. Hence, a maximum read signal is produced when a common word line voltage is close to the FETs voltage thresholds. Therefore, embodiments of the present invention provides a method to generate a word line read voltage, which will produce the largest read signal possible and track with process and temperature changes.

In embodiments of the present disclosure, a voltage read input can be received from a word line voltage generator in a non-volatile memory. Further, a first current can be output to a bit line true (BLT) based on the voltage read input being input to a gate of a first transistor of the non-volatile memory and a second current can be output to a bit line complement (BLC) based on the voltage read input being input to a gate of a second transistor of the non-volatile memory. A high differential read current can be generated through a difference between the first current and the second current. A logic level can be sensed based on the high differential read current.

Figure 1:
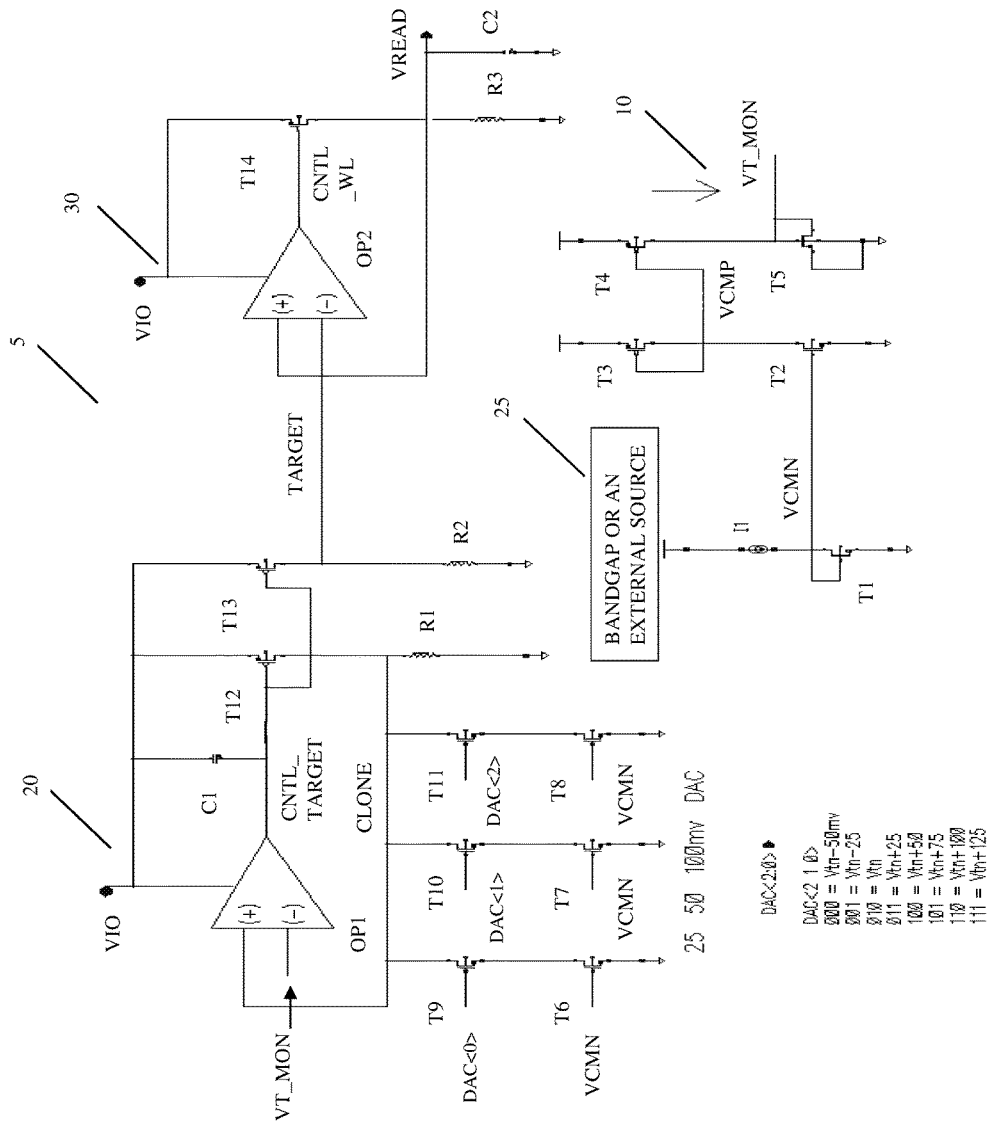
FIG. 1 shows a word line voltage generator in accordance with aspects of the present disclosure.

FIG. 1 shows a word line voltage generator in accordance with aspects of the present disclosure. In embodiments, a word line voltage generator 5 includes a voltage threshold monitor circuit 10, a digital to analog (DAC) adjustment circuit 20, and a buffer circuit 30. In the voltage threshold monitor circuit 10, a reference signal VCMN is derived from a current (i.e., I1) from a bandgap circuit or an external source 25. The reference signal VCMN is applied to a current mirror (e.g., transistors T2, T3, and T4) in the voltage threshold monitor circuit 10, which drives a current equal to the defined current at the voltage threshold (i.e., Vt) of the OTPM devices. The voltage threshold monitor circuit 10 comprises transistors T1, T2, T3, T4, and T5.

In an example of operation, transistor T5 is injected with a current I_Vt which equals the current at Vt., e.g., 300 nanoamperes-W/L. As a result, the diode configured T5 will develop the threshold voltage Vt, on its gate node of about, e.g., 350 mv. Further, in the embodiments, a multiple of OTPM cells are used in parallel to improve across-chip variation and achieve an average voltage threshold Vt on the voltage monitor (i.e., VT_MON) node. The differential storage cells (e.g., OTPM cell 0 to OTPM cell N in FIG. 2) are a one time programmable memory array (OTPM). Further, in embodiments, a group of 10 parallel cells would be biased with 10 of 16.8 microamperes/cell to generate the voltage threshold Vt on a gate to source voltage Vgs of transistor T5.

In embodiments, a differential storage cell word line gate voltage is biased to generate a high differential read current. A predetermined current (i.e., I1) may be injected into an array of FET devices (e.g., transistors T2-T5) to generate a voltage monitor signal (i.e., VT_MON). In embodiments, the predetermined current (e.g., I1) is received from a bandgap circuit. The voltage monitor signal is input to a summing circuit (e.g., transistors T6-T13) in which discrete voltage levels can be added or subtracted to the voltage monitor signal to generate a target voltage. In embodiments, the summing circuit (e.g., transistors T6-T13) includes a digital to analog converter for adding or subtracting to the voltage monitor signal. In embodiments, a word line control circuit for a differential memory array can include a voltage monitor circuit (e.g., voltage threshold monitor circuit 10) which receives a current into an array of FET devices to generate a voltage monitor, a digital to analog converter (e.g., transistors T6-T13) which adds or subtracts an overdrive voltage to the voltage monitor to generate an optimum read word line voltage.

In FIG. 1, the voltage monitor VT_MON is applied to a digital to analog (DC) adjustment circuit 20. The DC adjustment circuit 20 comprises an operational amplifier OP1, transistors T6-T13, capacitor C1, and resistors R1 and R2. The operational amplifier OP1 is a unity gain amplifier which replicates the input voltage VT_MON on a CLONE node across resistor R1 from current flowing through transistor T12. As the DAC inputs DAC <2:0> are enabled, current is diverted from node CLONE and a compensatory current is supplied by transistor T12 by action of the negative feedback loop with the operational amplifier OP1. The current in transistor T12 is mirrored to transistor T13 through a common gate connection. The voltage on node TARGET will be the current of transistor T12 (i.e., I12) times the ratio of resistor R2 divided by resistor R1 (i.e., R2/R1). Hence, a voltage lower than VT_MON can be achieved at a 0-DAC setting on node TARGET by making R2 greater than R1. As more DAC bits are enabled, more current is conducted by T12, which causes node TARGET to increment in 25 mV steps per DAC step.

In FIG. 1, the node TARGET is buffered by the buffer circuit 30. The buffer circuit 30 comprises an operational amplifier OP2, transistor T14, resistor R3, and capacitor C2. In embodiments, capacitors C1 and C2 are added for alternating current (AC) stability. The operational amplifier OP2 is a unity gain buffer which provides isolation and current amplification. The output signal VREAD of the buffer circuit 30 is output to word decoders (i.e., word decoder 0 to word decoder N) in FIG. 2.

Figure 2:
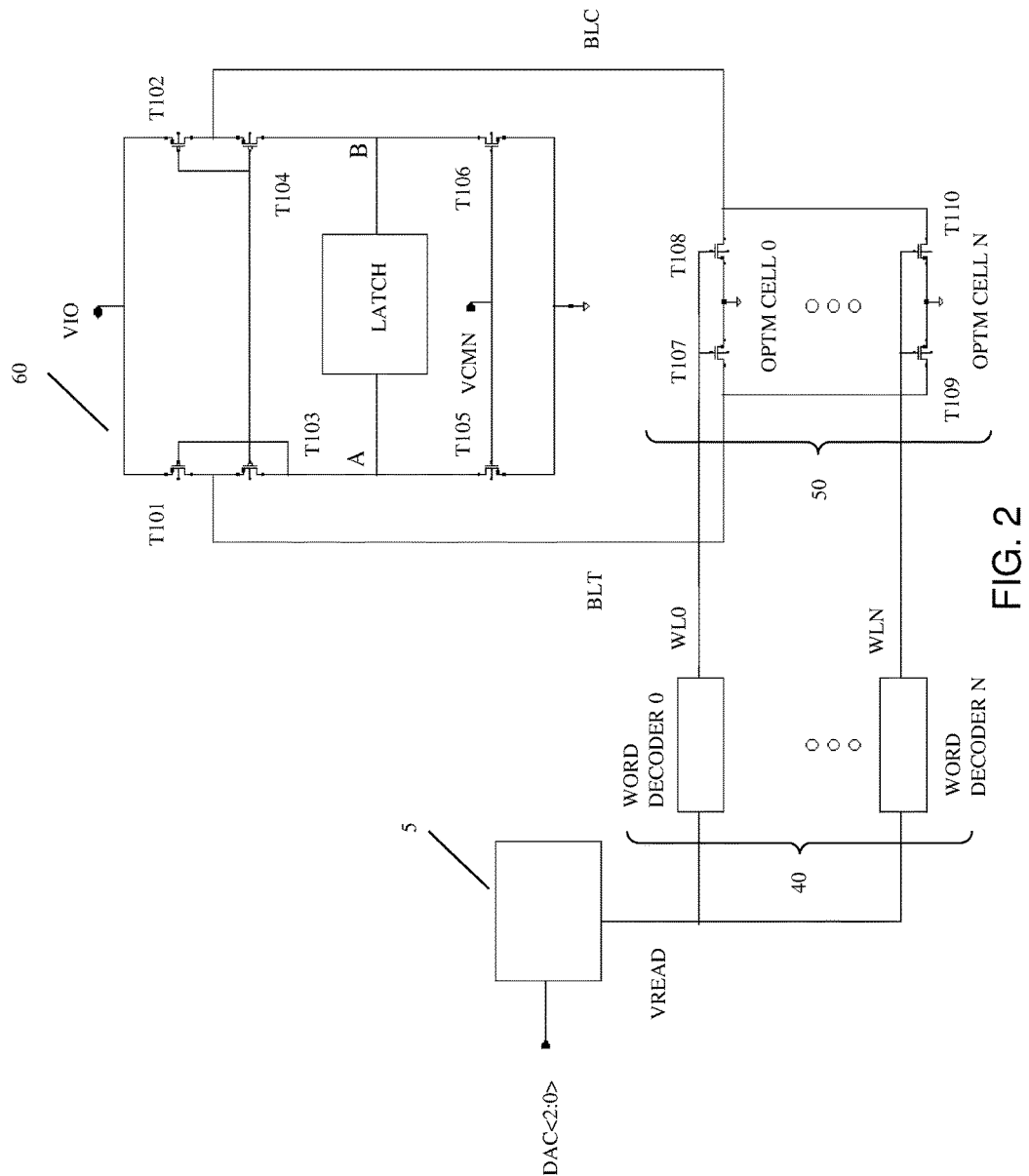
FIG. 2 shows a one time programmable memory array using the word line voltage generator in accordance with aspects of the present disclosure.

FIG. 2 shows a one time programmable memory array using the word line voltage generator of FIG. 1. The word line voltage generator 5 outputs the signal VREAD to word decoders 40. Further, the voltage generator 5 receives DAC inputs DAC <2:0> to adjust a voltage level. In an illustrative, non-limiting example, the adjusting of the voltage level may compensate for leakage, or adjust the VREAD voltage to the center of the Vt distribution of the OTPM array. In embodiments, word decoders 40 may comprise multiple word decoders, i.e., word decoder 0 to word decoder N, where N is an integer value representing the last word decoder of the word decoders 40.

An OTPM array 50 can be a non-volatile memory which includes a group of OTPM cells along bit lines bit line true (BLT) and bit line complement (BLC). Each of the OTPM cells contains a pair of field effect transistor (FET) devices (e.g., T107 and T108, T109 and T110) which have threshold voltages Vt different from each other as a result of programming. For example, a first transistor (e.g., T107 or T109) has a different threshold from a threshold voltage of a second transistor (e.g., T108 or T110). Also, the first transistor and the second transistor can be NFET devices. The OTPM array 50 may include a group of OTPM cells including OTPM cell 0 to OTPM cell N, wherein N is the integer value representing the last OTPM cell of the OTPM array 50. In embodiments, N is a same integer value for both the word decoders and the OTPM cell. Each OTPM cell is coupled to a word line (e.g., one of WL0 to WLN) which is driven from a word decoder (e.g., one of a corresponding word decoder 0 to word decoder N), and each word decoder (e.g., one of the corresponding word decoder 0 to word decoder N) receives the output signal VREAD, which determines the voltage level of the selected word line. In embodiments, the target voltage is driven to a plurality of differential storage cells (e.g., OPTM cell 0 to OPTM cell N) for biasing a word line gate voltage near a threshold voltage of an FET (e.g., T107 and T108 or T109 and T110). In embodiments, the high differential read current is read from the differential storage cell. The high differential read current can be sensed as a digital logic level in response to a positive polarity or negative polarity of the high differential read current. In embodiments, a plurality of FET memory cells (e.g., OPTM cell 0 to OPTM cell N) are arranged in differential transistor pairs (e.g., T107 and T108 or T109 and T110) and share a word line which corresponds to the optimum read word line voltage (e.g., VREAD). Further, in one example, the optimum read word line voltage is 100 mV above at least one of the differential transistor pairs, and the optimum read word line voltage tracks with temperature and process changes to maintain, e.g., 100 mV, of the overdrive voltage.

In FIG. 2, a sensing method for the OTPM performs current sensing where the differential bit line current is converted to a voltage and latched as a digital "1" or digital "0". When a word line (e.g., one of WL0 to WLN) is activated by a selected word decoder, its level is driven to the voltage of the signal VREAD. The signal VREAD has a voltage which is calculated by the word line voltage generator 5 to be an optimum level in response to process, voltage, and temperature (PVT) conditions. In this way, the voltage read input from the word line generator is optimized for process, voltage, and temperature (PVT). In embodiments, a BLT side of the selected cell (e.g., one of OPTM cell 0 to OPTM cell N) may have a field effect transistor (FET) with a higher threshold voltage than the corresponding field effect transistor (FET) on the BLC side. In this programming condition, the current on the bit line BLT will be less than the current on the bit line BLC. In FIG. 2, current sources in the sense amplifier inject current into the BLT and BLC nodes and into the selected cell. Initially, the current source input VCMN drives transistors T105 and T106, which conduct equal currents through transistors T101, T102, T103, and T104 (which are part of sensing circuit 60).

In embodiments, a differential current (i.e., I_BLT minus I_BLC) defines the current-signal, which causes a voltage imbalance on latch nodes A and B. The current sources formed by transistors T105 and T106 have very high output impedance, hence, a small change in current results in a large voltage change. In embodiments, with I_BLT less than I_BLC, node A will have a higher voltage than node B. For example, the transconductance gain can be high with a, e.g., 5 μa differential current-signal resulting in a differential voltage of about, e.g., 300 mV between nodes A and B. The latch signal across nodes A and B can easily be latched by a complementary metal-oxide-semiconductor (CMOS) latch and converted to a full logic level "1" or "0". In embodiments of the present disclosure, an OTMP system includes a word line control circuit, a latch which stores a differential voltage corresponding to a differential current output from the differential transistor pairs (e.g., T107 and T108 or T109 and T110) and a word decoder (e.g., one of word decoder 0 to word decoder N) which decodes the optimum read line word line voltage (e.g., VREAD) and outputs the word line (e.g., one of WL0 to WLN).

Figure 3:
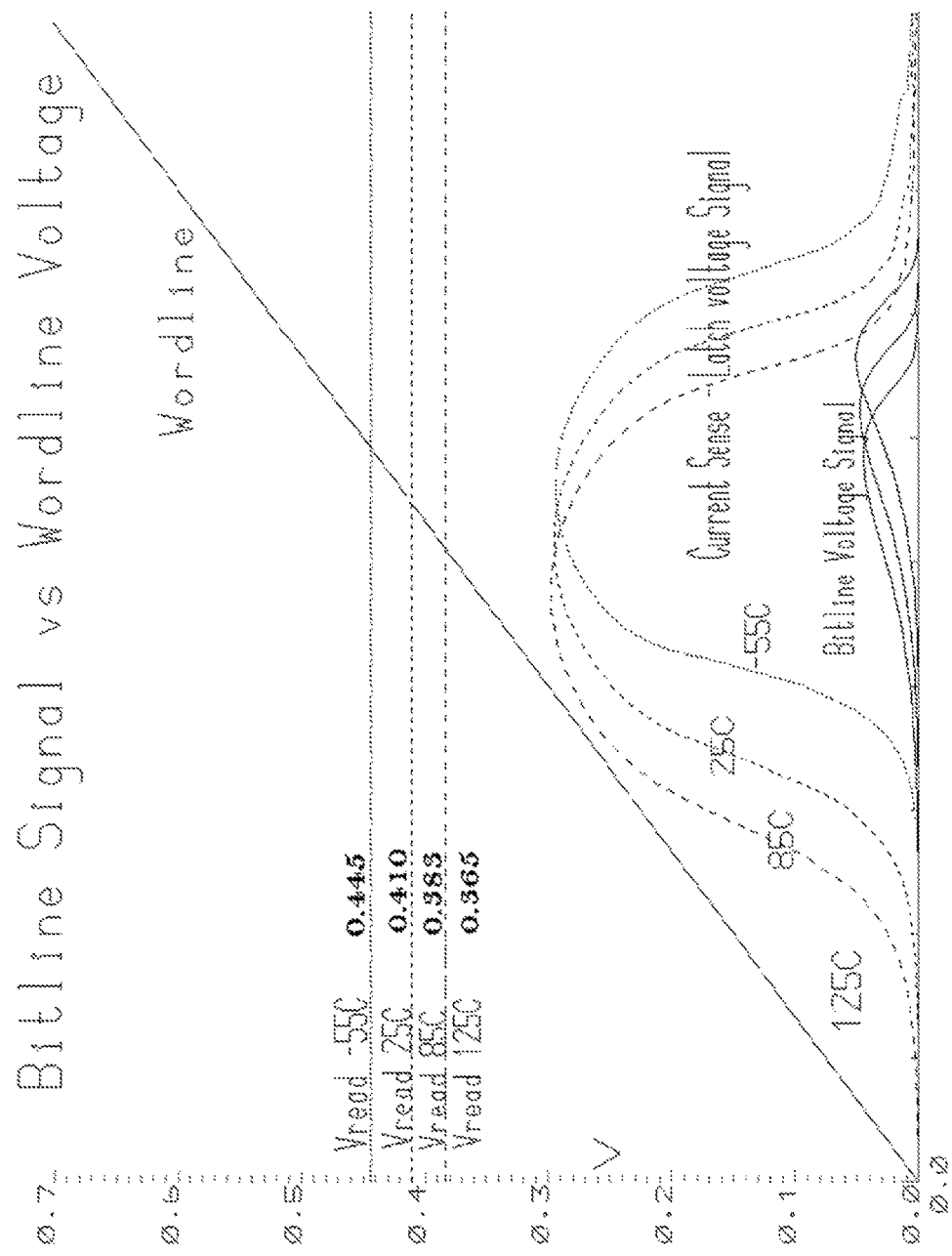
FIG. 3 shows a graph of a bitline signal plotted versus word line voltage in accordance with aspects of the present disclosure.

FIG. 3 shows a graph of a bitline signal plotted versus word line voltage in accordance with aspects of the present disclosure. In FIG. 3, the OTPM twin-cell is connected to a word line which is ramped up in time to demonstrate the read-signal sensitivity to word line voltage. In FIG. 3, the bit line differential voltage "bit line voltage signal" reaches a maximum of about 60 mV at −55° C. at a word line voltage of 0.5 V. Further, the maximum signal is obtained at a word line voltage of 0.415 at 125° C.

In FIG. 3, the range of operation for voltage-sensing is small compared to sensing the differential current on the bit lines. In embodiments of the present disclosure, using the described current sensing scheme, the "current sense-latch voltage signal" is about 300 mV with a word line voltage of 0.445 V at −55° C., and with a word line voltage of 0.365 V at 125° C.

As shown in FIG. 3, as the usable signal range is expanded with current sense, there is a need for a word line voltage generator which will generate an optimum word line voltage as process, voltage, and temperature (PVT) are varied. Accordingly, in embodiments the word line voltage generator 5 in FIG. 1 will generate the optimum word line voltage as PVT is varied.

Figure 4:
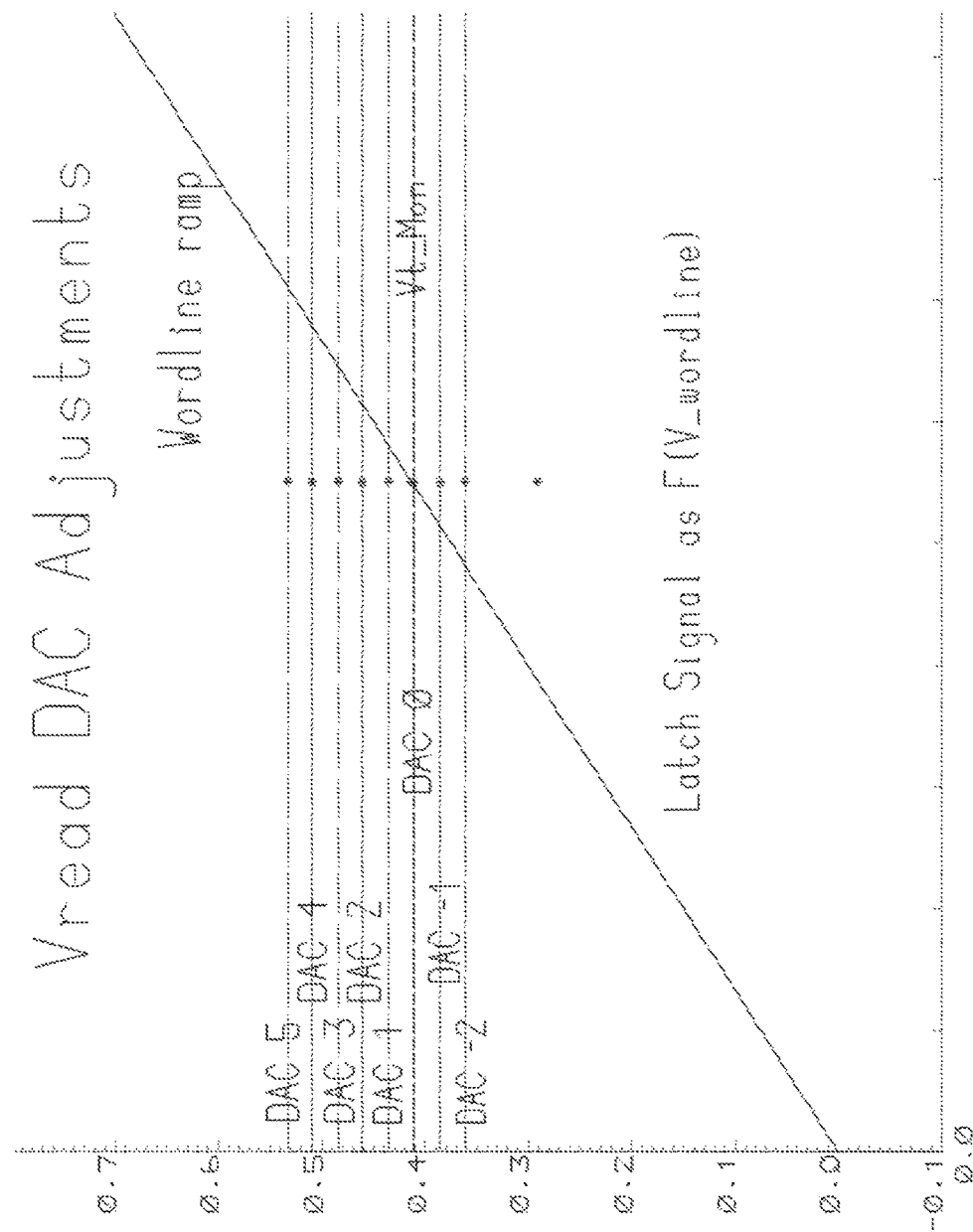
FIG. 4 shows a graph of digital to analog (DAC) adjustments to the VREAD signal in accordance with additional aspects of the present disclosure.

FIG. 4 shows a graph of digital to analog (DAC) adjustments to the VREAD signal in accordance with additional aspects of the present disclosure. In FIG. 4, the default VREAD voltage of a voltage threshold, i.e., Vt and DAC adjustments of −50 mV to +125 mV are shown. The latch signal is shown with a signal close to 300 mV at a VREAD level of a voltage threshold (i.e., Vt). Further, in FIG. 4, adjustments can be made to improve centering, to compensate for voltage drops within the array, or from leakage and to offset errors in the voltage monitor threshold circuit 10 of FIG. 1

The word line voltage generator for a programmable memory array of the present disclosure can be manufactured in a number of ways using a number of different tools. In general, though, the methodologies and tools are used to form structures with dimensions in the micrometer and nanometer scale. The methodologies, i.e., technologies, employed to manufacture the word line voltage generator for a programmable memory array of the present disclosure have been adopted from integrated circuit (IC) technology. For example, the structures are built on wafers and are realized in films of material patterned by photolithographic processes on the top of a wafer. In particular, the fabrication of the word line voltage generator for a programmable memory array uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of biasing a word line gate voltage of a differential storage cell to generate a high differential read current, comprising:

injecting a predetermined current into an array of FET devices to generate a voltage monitor signal;

inputting the voltage monitor signal to a summing circuit in which discrete voltage levels are added or subtracted to the voltage monitor signal to generate a target voltage;

driving the target voltage to a plurality of differential storage cells for biasing the word line gate voltage near a threshold voltage of a field effect transistor (FET);

reading the high differential read current from the differential storage cell; and sensing the high differential read current as a digital logic level in response to a positive polarity or negative polarity of the high differential read current.

2. The method of claim 1, wherein the predetermined current is received from a bandgap circuit.

3. The method of claim 1, wherein the summing circuit comprises a digital to analog converter for adding or subtracting to the voltage monitor signal.

4. The method of claim 1, wherein the differential storage cells is a one time programmable memory array (OTPM).

5. The method of claim 1, wherein the word line gate voltage is optimized for process, voltage, and temperature (PVT).

6. The method of claim 1, wherein the differential storage cells comprise a plurality of OTPM cells, and each of the OTPM cells include a plurality of NFET transistors which share a word line.

7. The method of claim 1, wherein the target voltage is driven to the plurality of differential storage cells for biasing the word line gate voltage to a center of a threshold voltage distribution of a one time programmable memory (OTPM) array.

8. A word line control circuit for a differential memory array, comprising:

a voltage monitor circuit which receives a current into an array of field effect transistor (FET) devices to generate a voltage monitor;

a digital to analog converter which adds or subtracts an overdrive voltage to the voltage monitor to generate an optimum read word line voltage; and a plurality of field effect transistor (FET) memory cells which are arranged in differential transistor pairs and which share a word line corresponding to the optimum read word line voltage.

9. The word line control circuit of claim 8, wherein the current is received from a bandgap circuit.

10. The word line control circuit of claim 8, further comprising a latch which stores a differential voltage corresponding to a differential current output from the differential transistor pairs.

11. The word line control circuit of claim 8, further comprising a word decoder which decodes the optimum read word line voltage and outputs the word line.

12. The word line control circuit of claim 8, wherein the optimum read word line voltage is 100 mV above at least one of the differential transistor pairs.

13. The word line control circuit of claim 8, wherein the optimum read word line voltage tracks with temperature and process changes to maintain 100 mV of the overdrive voltage.

14. The word line control circuit of claim 8, wherein the optimum read word line is adjusted to a center of a threshold voltage distribution of a one time programmable memory (OTPM) array.

* * * * *